United States Patent [19]

Dean et al.

[11] 3,999,283
[45] Dec. 28, 1976

[54] METHOD OF FABRICATING A PHOTOVOLTAIC DEVICE

[75] Inventors: Raymond Harkless Dean, Shawnee Mission, Kans.; Louis Sebastian Napoli, Hamilton Square; Shing-Gong Liu, Princeton, both of N.J.

[73] Assignee: RCA Corporation, New York, N.Y.

[22] Filed: June 11, 1975

[21] Appl. No.: 585,798

[52] U.S. Cl. .......................... 29/572; 136/89 R; 357/30; 357/81
[51] Int. Cl.² .................. H01L 31/18; H01L 31/06
[58] Field of Search ................... 136/89; 29/572

[56] References Cited

UNITED STATES PATENTS

| | | | |
|---|---|---|---|
| 2,034,334 | 3/1936 | Falkenthal | 136/89 |
| 2,989,575 | 6/1961 | Wallace, Jr. | 136/89 |
| 3,018,313 | 1/1962 | Gattone | 136/89 |
| 3,232,795 | 2/1966 | Gillette | 136/89 |

*Primary Examiner*—John H. Mack
*Assistant Examiner*—Aaron Weisstuch
*Attorney, Agent, or Firm*—Glenn H. Bruestle; Daniel N. Calder

[57] ABSTRACT

Solar radiation is concentrated on a solar cell of a photovoltaic device in the range of 500 to 1600 suns. The photovoltaic device includes a plurality of solar cells on a flat surface of a heat sink, and means for concentrating solar radiation on the solar cells. The solar cells have a surface on which the solar light is incident. This high concentration of solar energy on the solar cell will increase the solar cell operating temperature. The dimensions of the solar cells and the center to center spacing between solar cells is such that good thermal dissipation is maintained in the photovoltaic device.

8 Claims, 3 Drawing Figures

METHOD OF FABRICATING A PHOTOVOLTAIC DEVICE

BACKGROUND OF THE INVENTION

This invention relates to a photovoltaic device and more particularly to a photovoltaic device having solar radiation concentration in the range of 500 to 1600 suns.

Photovoltaic solar concentrations have been used to increase the amount of solar radiation incident onto a solar cell. Typically, the increase in solar radiation is a result of the magnification power of a lens through which solar radiation traverses to be focused onto a solar cell. As the magnification of the lens is increased the amount of thermal energy incident onto the solar cell is also increased. However, the efficiency of a solar cell will decrease as the temperature of the solar cell is increased. In the past a photovoltaic solar concentrator device could not operate at about more than 280 suns before the efficiency of the solar cell is dramatically reduced, i.e. less than 4% efficiency. It would be most desirable in the field of photovoltaic devices to have a photovoltaic solar concentrator device that could efficiently operate at high solar concentrations, i.e. 500 to 1600 suns, and yet not reduce solar cell efficiency because of high solar cell operating temperatures.

SUMMARY OF THE INVENTION

A photovoltaic device with solar radiation concentration including a heat sink having a flat surface. A plurality of solar cells are mounted in spaced relation on the flat surface and each of the solar cells has an incident surface on which solar radiation impinges. One half the center to center spacing, $r_f$, between the solar cells is related to the area of the incident surface of the solar cell by the formula $(r_o) \geq {}^{1/2}(C)(r_f)^2$ where "$C$" is a constant determined by the heat dissipation quality of the heat sink, and "$r_o$" is the radius of a circle equivalent in area to the incident surface of the solar cell. There are separated means for concentrating solar radiation on the incident surface of each solar cell.

DETAILED DESCRIPTION OF THE INVENTION

Figure 1:
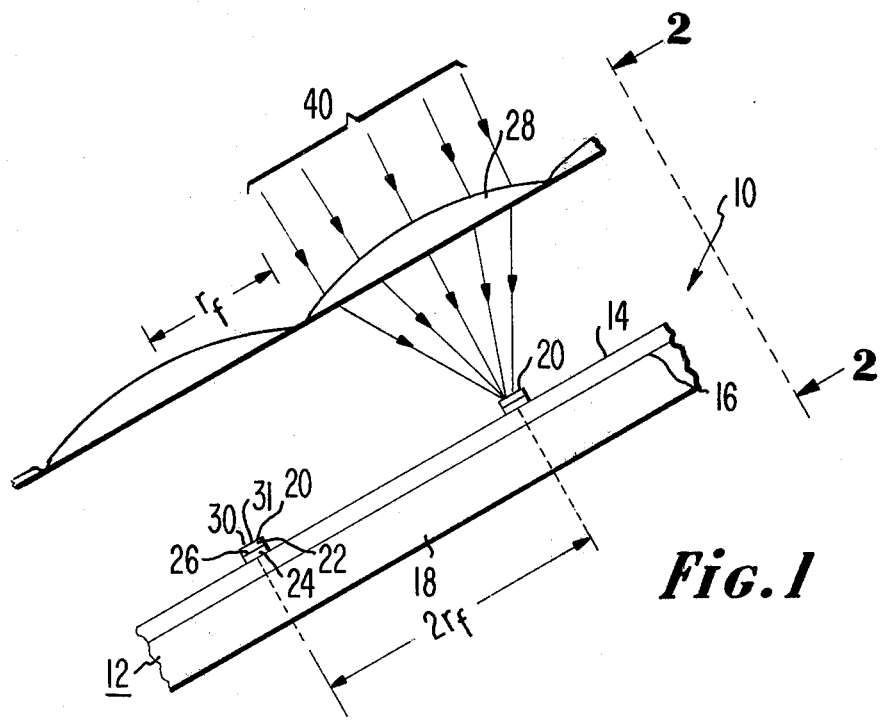
FIG. 1 is a side view of the photovoltaic device with solar radiation concentration of the present invention.
Figure 2:
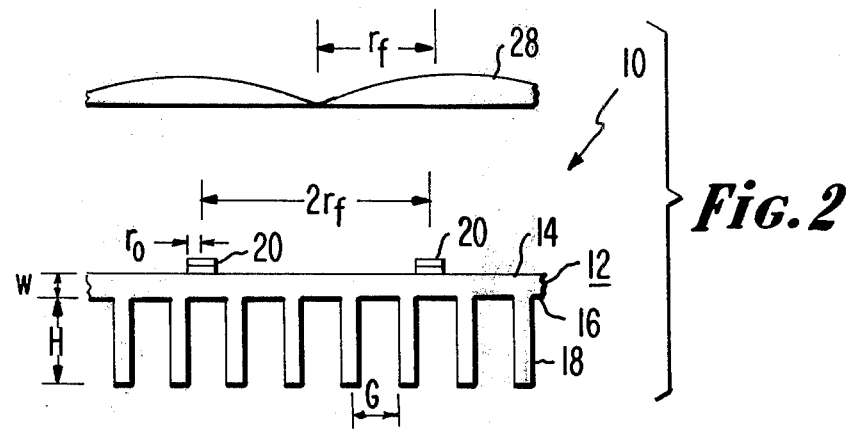
FIG. 2 is a view of the photovoltaic device along the line 2—2 of FIG. 1.

Referring to FIGS. 1 and 2, a photovoltaic device having solar radiation concentration is designated as 10. The photovoltaic device 10 comprises a heat sink 12 having a flat surface 14 and a surface 16 opposite the flat surface 14. Projecting from the opposite surface 16 and extending substantially perpendicular to the surface 16 are a plurality of fins 18. The fins 18 are spaced from each other and are substantially parallel to each other. The spacing between fins is designated by G. The heat sink 12 is of a thickness from the flat surface 14 to the opposite surface 16, designated as $w$. The fins 18 are of a length, H, extending from the opposite surface 16. The heat sink 12 and the fins 18 are of a material having good thermal conductivity, such as copper or aluminum.

On the flat surface 14 are a plurality of solar cells 20. Each of the cells 20 is cylindrical in shape, having a first region 22 of one conductivity type in intimate contact with a second region 24 of the opposite conductivity type and a P-N junction 26, therebetween. The cells 20 are mounted in a spaced relationship on the heat sink 12 with second region 24 contacting the flat surface 14 of the heat sink. Each of the solar cells 20 has an incident surface 31, on which impinges solar radiation. The incident surface 31 is circular in shape and faces away from the flat surface 14 of the heat sink 12. For purposes of this discussion, the photovoltaic device 10 has eight solar cells and the first region 22 is of P-type conductivity while the second region 24 is of N-type conductivity. Typically, the solar cells 20 are of a semiconductor material such as silicon. The center to center spacing of the solar cells 20 from each other, on flat surface 14, is a function of the solar cell 20 size and other design parameters. The center to center spacing of solar cells 20 is determined by the formula $(r_o) \geq {}^{1/2}(C)(r_f)^2$ where "$r_o$" is the radius of the solar cell 20, "$C$" is a constant determined by the heat dissipation capabilities of the heat sink 12 and "$r_f$" is one-half the spacing between the centers of the solar cells 20. The constant "$C$" will be described in more detail later on.

A grid contact 30 is on the incident surface 31 of the solar cell 20. Typically, the grid contact 30 is of metal having good electrical conductivity properties, such as gold. Solar radiation striking the grid contact 30 may be reflected from the grid contact 30 and never impinge the incident surface 31. Therefore, the grid contact 30 should not cover a significant percentage of the incident surface 31 area, usually no more than 5% of the incident surface area.

A plurality of refractory lens 28, circular in shape, are spaced from the solar cells 20 and are in a plane parallel to the heat sink 12. Each refractory lens 28 is spaced from a solar cell 20, so that the solar cell 20 is approximately at the focal point of a lens 28. The focal point of a refractory lens 28 is the point on the optical axis of the lens at which converge light rays which prior to impinging the lens were parallel to the optical axis of the lens.

Figure 3:
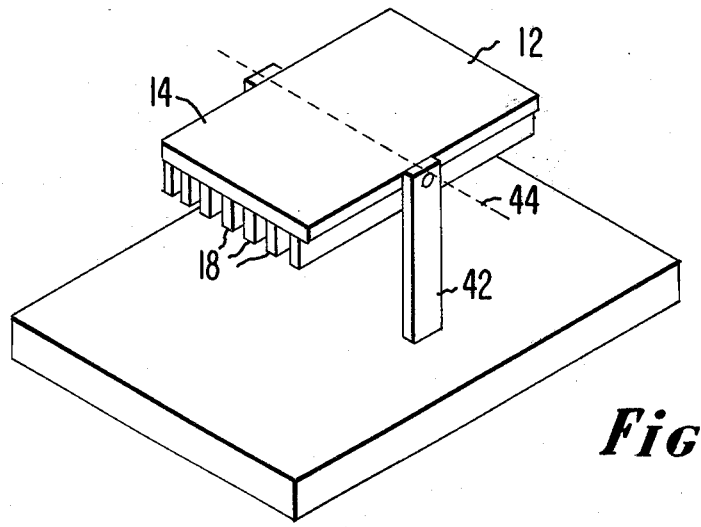
FIG. 3 is a perspective view of the mounting of the photovoltaic device.

Referring to FIG. 3, the heat sink 12 of the photovoltaic device 10 is shown mounted on a pivotal mount 42 having a pivotal axis 44. The fins 18 are oriented on the device 10 so that they are perpendicular to the pivotal axis 44. This orientation of the fins 18 does not inhibit heat transfer from the fins 18 by means of natural convection.

In the operation of the photovoltaic device 10, solar radiation, designated as 40, is incident on the refractory lens 28. After traversing the lens 28, the solar radiation 40 is concentrated onto the solar cells 20 in a concentration in the range of 500 to 1600 suns. That is to say, the lens 28 magnifies the solar radiation in the range of 500 to 1600. The power density on earth of solar radiation without any magnification is one sun and it is equal to 0.1 watts/cm². Magnification of a lens is the ratio of the area of the lens to the area on which the lens is focused. Since both the incident surface 31 of solar cell 20 and the refractory lens 28 are circular in shape, the magnification of the lens is equal to the ratio squared of the radius of the lens 28 to the radius of the incident surface 31.

This concentration of solar radiation 40 onto the solar cell 20 can result in the increased absorption of the solar radiation 40 into the solar cells 20. Solar radiation 40 focused on the solar cells 20 at the incident surface 31 may pass through either the first or second regions 22 and 24 and be absorbed therein. If the solar radiation 40 is absorbed in either the first or second regions 22 and 24 an electron-hole pair is created at the point of absorption. Electron carriers which are created in a P-type region, such as the first region 22, and hole carriers which are created in an N-type region, such as the second region 24, are termed minority carriers in these respective regions. If these minority carriers are generated within their diffusion length of the P-N junction 26, so as to make possible their diffusion across the P-N junction 26, a useable current will be generated within the solar cell 20.

The efficiency of the solar cells 20 is a function of the operating temperature of the cells. When operated at high temperatures, in the order of 200° C, the efficiency of a solar cell is reduced to the order of about 0%. In the photovoltaic device 10 the operating temperature of the solar cell 20 can be maintained at a temperature of about 20° C above the ambient, to assure little degradation in solar cell efficiency even with solar radiation concentration in the range of 500 to 1600 suns.

One factor utilized by the photovoltaic device 10 of the present invention to maintain a suitable solar cell operating temperature is to use a plurality of smaller solar cells and lens instead of one large solar cell and one large lens. For purposes of explanation, assume one lens of one meter in diameter were to focus solar radiation of a power density of 100 watts/cm$^2$ onto one solar cell of 3 cm in diameter as compared to ten lens of 10 cm in diameter focusing solar radiation of a power density of 100 watts/cm$^2$ onto 10 solar cells of 3mm in diameter. Although the same power density was focused on both the one larger 3 cm solar cell and the ten smaller 3mm solar cells, the temperature rise in the ten smaller solar cells would be much lower, as much as a factor of 10 to 100 lower. Thus, the solar cell operating temperature can be lowered by using a plurality of smaller cells and lens.

Also, to achieve good dissipation of heat from each of the solar cells 20, so as to maintain a suitable solar cell 20 operating temperature it has been found that the square root of the radius $r_o$ of a solar cell 20 should be equal to or greater than the product of the constant "C" and the square of one-half the center to center spacing, $r_f$, between solar cells 20. In the photovoltaic device 10 the refractory lens 28 is approximately centered above the solar cell 20 so as to focus solar radiation 40 onto the solar cell 20. Also, the lens 28 has a radius equal to approximately one-half the distance between solar cells, $r_f$. The concentration of thermal energy focused onto the solar cell 20 varies with the variation of the lens 28 radius. The larger the lens 28 radius, keeping the solar cell radius $r_o$ constant, the greater the magnification of thermal energy on the solar cell 20, and as the solar cell spacing $r_f$ increases, so does the radius of the lens 28. Therefore, the solar cell spacing $r_f$ is a determining factor in the thermal energy concentrated on the solar cell 20 and must be considered in the thermal design of the photovoltaic device 10.

The formula $(r_o)^{1/2} \geq (C)(r_f)^2$, which related cell 20 radius to the spacing between cells 20 to bring about good thermal dissipation, is the approximate solution to two simultaneous differential equations. One of these equations relates the temperature drop along the heat sink 12 and the second equation relates the heat loss along the heat sink 12. It is understood that heat energy is dissipated from the heat sink 12 by both radiation and convection, while heat flows through the heat sink 12 by conduction. Conduction is a process by which heat flows from a region of higher temperature to a region of lower temperature within a medium or between different mediums in direct physical contact. Convection is a process of energy transport by the combined action of heat conduction, energy storage, and mixing motion. Convection is most important as a mechanism of energy transfer between a solid surface and a liquid or a gas. Radiation is a process by which heat flows from a high temperature body to a body at a lower temperature when the bodies are separated in space.

The differential change in temperature, $dT$, at a position, r, from the solar cell 20 on the heat sink 12, is related to the local heat flow Q at a position r on the heat sink 12 by the differential equation:

$$\frac{dT}{dr} = \frac{Q}{(2\pi r)(k)(w)} \qquad (1)$$

where "$2\pi rw$" is the cross-sectional area through which the heat flow Q traverses where "$w$" is the thickness of the heat sink; and "$k$" is the thermal conductivity of the heat sink 12.

The differential change in heat flow, $dQ$, at a position, r, from the solar cell 20 on the heat sink 12 is related to the local temperature elevation above ambient, T, at a position, r, on the heat sink 12 by the differential equation:

$$dQ = -2\pi r(T)(\S)dr \qquad (2)$$

where "$2\pi r dr$" is the incrimental area from which the heat convects and radiates from the heat sink 12, and "§" is a combination of the linearized radiation and convection coefficients of the heat sink 12 as cited in "Marks' Mechanical Engineers' Handbook" edited by T. Bauneister, 6th edition, McGraw-Hill Book Co., Inc., 1958. More specifically, " § " is a constant dependent on the radiation and convection heat dissipation condition of the surface of heat sink 12, i.e. the surface area of the heat sink 12, the emission of the heat sink surface, and the atmospheric conditions at the heat sink surface.

The formula $(r_o)^{1/2} \geq (C)(r_f)^2$ is an approximation to the first and second differential equations where the boundary conditions are that at the edge of the heat sink, heat does not flow, and at that position on the heat sink where the solar cell is centered the heat is equal to the total heat energy collected by the lens 28. In stating that the formula $(r_o)^{1/2} \geq (C)(r_f)_2$ is an approximation to the solution of the first and second differential equations, it is because this formula is simplified by not taking into account a Bessel function with an imaginary argument which is part of the solution of the two differential equations. The Bessel function is:

$$\frac{1}{r_o^{1/2} \left(\frac{\S}{kw}\right)^{1/4}} \left\{ \frac{I_1\left(\sqrt{\frac{\S}{kw}}r_f\right) K_o\left(\sqrt{\frac{\S}{kw}}r_o\right) + I_o\left(\sqrt{\frac{\S}{kw}}r_o\right) + K_1\left(\sqrt{\frac{\S}{kw}}r_f\right)}{I_1\left(\sqrt{\frac{\S}{kw}}r_f\right) K_1\left(\sqrt{\frac{\S}{kw}}r_o\right) - I_1\left(\sqrt{\frac{\S}{kw}}r_o\right) K_1\left(\sqrt{\frac{\S}{kw}}r_f\right)} \right\} \quad (3)$$

where $I_o$ is the Modified Bessel function of the first kind and first order; $I_1$ is the Modified Bessel function of the first kind and second order; $K_o$ is the Modified Bessel function of the second kind and first order; and $K_1$ is the Modified Bessel function of the second kind and second order. The Bessel function of equation 3 is very complex and is of a value of about 1.0 for the photovoltaic device 10 operating in the range of 500 to 1600 suns and where $$.01 < r_o \sqrt{\frac{\S}{kw}} < .1.$$

Even with an approximation of the Bessel function the formula $(r_o)^{1/2} \geq (C) (r_f)^2$ can never be in error by more than a factor of 2. An error of no more than a factor of two is quite tolerable in the design of the photovoltaic device 10 of the present invention. With an approximation of the Bessel function $$C \approx \frac{Aq_o}{2\Delta T k w \left(\frac{\S}{kw}\right)^{1/4}} \quad (4)$$

where "$q_o$" is that portion of the incident solar energy flux on the cell 20 which is converted to heat; and "A" is the approximation of the Bessel function of equation 3; $\alpha T$ is the rise in the temperature above ambient of the heat sink 12 and solar cell 20; "$w$" is the thickness of the heat sink 12; "$k$" is the thermal conductivity of the heat sink 12; and "$\S$" is a combination of the linearized radiation and convection coefficients of the heat sink 12. The value of "$q_o$" is about 0.9 w/cm² at air mass one, which normally occurs at seal level.

We will now discuss with more specificity the parameters which determine the constant "C", referring to equation 4.

Some of the heat generated in the solar cell 20 flows to the heat sink 12 by thermal conduction. Thus, how well the heat sink 12 dissipates this heat is significant in keeping down the local temperature rise of the solar cell 20 and in determining the constant "C". The material of heat sink 12 and the thickness, $w$, of heat sink 12 are important in determining the constant "C" since, as is well known in the art, the quantity of radiative thermal dissipation from the heat sink 12 is determined by the surface conditions of the heat sink 12. Also, well known in the art is that the thermal conductivity, $k$, of the heat sink 12 is a function of the heat sink 12 material. Factors involved in the determination of the constant §, the combination of the radiation and convection coefficients and subsequently the constant "C" are the length, (H), and spacing, G, of the heat sink fins 18; the atmospheric conditions at the surface of the heat sink 12 and the color or emissivity of the surface of the heat sink 12. As is well known in the art, the more surface area there is of heat sink 12 the more radiation and convection of heat from these surfaces. Obviously, a heat sink having fins has more surface area to dissipate heat than one without fins. Thus, this is the reason why the length, H, of the fins 18 and spacing, G, between fins 18 are considered in the determination of the constant "C". Atmospheric conditions at the heat sink 12 surface are important since it determines the ambient condition in which the photovoltaic device 10 will operate, and if the ambient air has a wind velocity more heat is convected from the heat sink 12 by forced convection. As for the color of the surface of heat sink 12, it determines the emissivity of the surfaces of heat sink 12. Well known in the art of thermal design is that thermal radiation of surfaces which are black in color is much better than surfaces which are white in color. Typically, the surfaces of the heat sink 12 are coated with a flat black enamel so that they are black in color. Furthermore, a factor which must be considered in determining the constant "C" is the desired amount of temperature rise $\alpha T$ in the solar cell 20 and heat sink 12 as a result of the thermal energy directed onto them from the lens 28. As previously stated, a rise of only 20° C above the ambient for both the heat sink 12 and the solar cell 20 is desirable to prevent a degradation in the solar cell 20 operating efficiency on the surface of the earth.

The following is an example of the typical design parameters used in the fabrication of the photovoltaic device 10 of the present invention. With a solar concentration of 1000 suns and solar cells radius, $r_o$, of 0.15 cm, one half the center to center spacing between solar cells 20, $r_f$, can be calculated after the constant "C" of the formula $(r_o)^{1/2} \geq (C) (r_f)^2$ is determined. As previously stated the constant "C" is determined from the formula $$C \approx \frac{Aq_o}{2\Delta T k w \left(\frac{\S}{kw}\right)^{1/4}}.$$

As previously stated, a tolerable rise in temperature, $\alpha T$, above the ambient is 20°C for both the heat sink 12 and solar cell 20. The solar energy flux on the cell 20 converted to heat is 0.09w/cm² at air mass one.

If the heat sink 12 is aluminum of a thickness "$w$" of 0.15 cm its thermal conductivity, $k$, is equal to 2.1. The constant "A" is equal to 1 since the photovoltaic device is operated in the range of 500 to 1600 suns and $$.01 < r_o \sqrt{\frac{\S}{kw}} < .1.$$

If the ratio of fin length to fin spacing, G/H, is equal to 2, and the surfaces of the heat sink 12 are black so that its emissivity is 0.95 and with an atmospheric condition of 0 MPH wind velocity, the combination of the radiation and convection coefficients, $\S$, is $6 \times 10^{-3}$. Therefore, from the formula $(r_o)^{1/2} \geq (C)(r_f)^2$ it is determined that $r_f$ is 5 cm. Since one half the spacing between solar cells $r_f$ is about equal to the radius of the lens 28, the lens 28 is of a diameter of about 10cm.

It is anticipated by the photovoltaic device 10 of the present invention that the means for concentrating solar light onto solar cell 20 need not be a refractory lens 28, but may be a reflecting lens. Also anticipated by the present invention is that the solar cell 20 and lens 28 need not be circular in shape but may be any shape such as a square. In the discussion of the photovoltaic device 10 the solar cell was cylindrical and the radius of the incident surface 31 was designated $r_o$. If the incident surface is not in the shape of a circle then $r_o$ in the formula $(r_o)^{1/2} \geq (C)(r_f)^2$ is the radius of a circle of an area equivalent to the incident surface 31 of the solar cell 20.

In the photovoltaic device 10 it is furthermore anticipated that the solar cells 20 may be a "violet solar cell" having a P-N junction 26 formed by a shallow diffusion of 1000 to 1500 A, as compared to other solar cells having a PN junction formed by a diffusion of 4000A. The "violet solar cells" do not suffer from solar energy conversion in the short wavelength as do solar having a P-N junction formed by a deeper diffusion. The heat sink 12 of the photovoltaic device 10 has been described as having fins 18. As stated previously, the fins 18 provide additional surface area from which heat energy is dissipated from the heat sink 12. While fins are preferred on the heat sink 12 they are not necessary to carry out the present invention. If fins are not provided as a part of the heat sink 12 then a heat sink of a much larger mass must be used to dissipate the equivalent amount of heat that would be dissipated from a heat sink 12 having fins.

The photovoltaic device 10 provides solar light concentration on a solar cell in the range of 500 to 1600 suns, without substantial degradation in solar cell efficiency.

We claim:

1. In a method of fabricating a photovoltaic device having a heat sink with a flat surface, a plurality of solar cells, each of which has an incident surface on which solar radiation is capable of impinging and separated means for concentrating solar radiation on the incident surface of each solar cell, the step of:

mounting said solar cells in spaced relation on the flat surface of said heat sink with one half the center to center spacing, $r_f$, between said solar cells being related to the area of said solar cell incident surface by the formula $(r_o)^{1/2} \geq (C)(r_f)^2$ where "$r_o$" is the radius of a circle equivalent in area to the incident surface of said solar cell, and "C" is a constant determined by the heat dissipation quality of said heat sink with "C" being approximately equal to $$\frac{Aq_o}{2\Delta Tkw \left(\frac{\S}{kw}\right)^{1/4}},$$

wherein "A" is equal to 1 when $$.01 < r_o \sqrt{\frac{\S}{kw}} < .1,$$

$\alpha T$ is the rise in the temperature above ambient of said heat sink and solar cell, "$w$" is the thickness of said heat sink, "$q_o$ is that portion of the incident solar energy flux on each cell which is converted to heat, "$k$" is the thermal conductivity of said heat sink, and "$\S$" is a combination of the radiation and convection coefficients of said heat sink.

2. The method in accordance with claim 1 wherein the means for concentrating solar radiation on the incident surface of said solar cell has a magnification power in the range of 500 to 1600.

3. The method in accordance with claim 2 where "A" is equal to the Bessel function relation:

$$\frac{1}{r_o{}^{1/2}\left(\frac{\S}{kw}\right)^{1/4}}\left\{\frac{I_1\left(\sqrt{\frac{\S}{kw}}r_f\right)K_o\left(\sqrt{\frac{\S}{kw}}r_o\right)+I_o\left(\sqrt{\frac{\S}{kw}}r_o\right)+K_1\left(\sqrt{\frac{\S}{kw}}r_f\right)}{I_1\left(\sqrt{\frac{\S}{kw}}r_f\right)K_1\left(\sqrt{\frac{\S}{kw}}r_o\right)-I_1\left(\sqrt{\frac{\S}{kw}}r_o\right)K_1\left(\sqrt{\frac{\S}{kw}}r_f\right)}\right\} \quad (3)$$

where $I_o$ is the Modified Bessel function of the first kind and first order; $I_1$ is the Modified Bessel function of the first kind and second order; $K_o$ is the Modified Bessel function of the second kind and first order; and $K_1$ is the Modified Bessel function of the second kind and second order.

4. The method in accordance with claim 3 wherein the combination of the radiation and convection coefficients, $\S$, is determined by the atmospheric conditions at the surface of said heat sink, the emissivity of the heat sink surfaces and the surface area of said heat sink.

5. The method in accordance with claim 1, wherein the means for concentrating solar radiation are refractory lenses, with each lens spaced from an associated solar cell so as to focus solar radiation traversing said lens onto the incident surface of said solar cell.

6. The method in accordance with claim 1 wherein the means for concentrating solar radiation are reflecting lenses with each lens spaced from a solar cell so as to focus solar radiation striking said lens onto the incident surface of said solar cell.

7. The method in accordance with claim 1 wherein said heat sink is provided with fins in separated relation on a surface opposite said flat surface, projecting from and approximately perpendicular to said opposite surface.

8. The method in accordance with claim 1, wherein the solar cell is cylindrical in shape with the incident surface circular in area and the separated means for concentrating solar radiation are each circular in shape.

* * * * *

UNITED STATES PATENT OFFICE
CERTIFICATE OF CORRECTION

PATENT NO. : 3,999,283
DATED : December 28, 1976
INVENTOR(S) : Raymond Harkless Dean et al It is certified that error appears in the above-identified patent and that said Letters Patent are hereby corrected as shown below:

| | |
|---|---|
| Col. 4, line 62 | "$(r_o)^{1/2} \geq (C)(r_f)_2$" should be -- $(r_o)^{1/2} \geq (C)(r_f)^2$ -- |
| Col. 5, line 39 | "$\alpha T$" should be -- $\Delta T$ -- |
| Col. 5, line 45 | "seal" should be -- sea -- |
| Col. 6, line 30 | "$\alpha T$" should be -- $\Delta T$ -- |
| Col. 6, line 40 | "solar cells" should be -- solar cell -- |
| Col. 6, line 53 | "$\alpha T$" should be -- $\Delta T$ -- |
| Col. 7, Line 25 | after "solar" insert -- cells -- |
| Col. 8, line 13 | "$\alpha T$" should be -- $\Delta T$ -- |
| Col. 8, line 15 | "$q_o$ should be -- "$q_o$" -- |
| Col. 8, line 16 | "to" should be -- into -- |

Signed and Sealed this

Third Day of May 1977

[SEAL]

Attest:

RUTH C. MASON
*Attesting Officer*

C. MARSHALL DANN
*Commissioner of Patents and Trademarks*